United States Patent
Ahn et al.

(10) Patent No.: US 8,924,639 B2
(45) Date of Patent: Dec. 30, 2014

(54) INDEPENDENTLY CONTROLLABLE AND RECONFIGURABLE VIRTUAL MEMORY DEVICES IN MEMORY MODULES THAT ARE PIN-COMPATIBLE WITH STANDARD MEMORY MODULES

(75) Inventors: Jung Ho Ahn, Menlo Park, CA (US); Norman P. Jouppi, Palo Alto, CA (US); Robert S. Schreiber, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 742 days.

(21) Appl. No.: 13/058,048

(22) PCT Filed: Aug. 8, 2008

(86) PCT No.: PCT/US2008/009522
§ 371 (c)(1),
(2), (4) Date: Feb. 8, 2011

(87) PCT Pub. No.: WO2010/016817
PCT Pub. Date: Feb. 11, 2010

(65) Prior Publication Data
US 2011/0145504 A1    Jun. 16, 2011

(51) Int. Cl.
*G06F 12/00* (2006.01)
*G06F 12/06* (2006.01)
*G11C 5/04* (2006.01)
*G11C 8/12* (2006.01)
*G06F 13/16* (2006.01)

(52) U.S. Cl.
CPC *G11C 5/04* (2013.01); *G06F 12/06* (2013.01); *G06F 2212/1028* (2013.01); *Y02B 60/1225* (2013.01); *Y02B 60/1228* (2013.01); *G06F 12/0646* (2013.01); *G11C 8/12* (2013.01); *G06F 13/1684* (2013.01)
USPC .................. 711/105; 711/E12.069; 711/170; 711/6

(58) Field of Classification Search
USPC .......................................... 711/129
See application file for complete search history.

(56) References Cited

U.S. PATENT DOCUMENTS

| | | | |
|---|---|---|---|
| 4,707,802 A | 11/1987 | Takahashi | |
| 5,960,468 A | 9/1999 | Paluch | |

(Continued)

FOREIGN PATENT DOCUMENTS

| | | |
|---|---|---|
| JP | 2003-006042 | 1/2003 |
| JP | 2006-236105 | 9/2006 |

(Continued)

OTHER PUBLICATIONS

Search Report, EP Communication, Supplementary European Search Report, Jul. 29, 2011.

(Continued)

*Primary Examiner* — Reginald Bragdon
*Assistant Examiner* — Hamdy S Ahmed

(57) ABSTRACT

Various embodiments of the present invention are directed multi-core memory modules. In one embodiment, a memory module (500) includes memory chips, and a demultiplexer register (502) electronically connected to each of the memory chips and a memory controller. The memory controller groups one or more of the memory chips into at least one virtual memory device in accordance with changing performance and/or energy efficiency needs. The demultiplexer register (502) is configured to receive a command indentifying one of the virtual memory devices and send the command to the memory chips of the identified virtual memory device. In certain embodiments, the memory chips can be dynamic random access memory chips.

11 Claims, 14 Drawing Sheets

(56) References Cited

U.S. PATENT DOCUMENTS

| | | |
|---|---|---|
| 6,310,817 B1 | 10/2001 | Kablanian |
| 2002/0196695 A1 | 12/2002 | Pascucci |
| 2004/0073743 A1 | 4/2004 | Arimilli et al. |
| 2004/0256638 A1 | 12/2004 | Perego et al. |
| 2005/0169097 A1 | 8/2005 | Ware et al. |
| 2008/0031030 A1 | 2/2008 | Rajan et al. |

FOREIGN PATENT DOCUMENTS

| | | |
|---|---|---|
| JP | 2009-301415 | 12/2009 |
| WO | WO-2007/038255 | 4/2007 |
| WO | WO-2007/095080 | 8/2007 |
| WO | WO-2007095080 A2 | 8/2007 |

OTHER PUBLICATIONS

International Search Report, PCT/US2008/009522, Jan. 22, 2009, 14 pages.

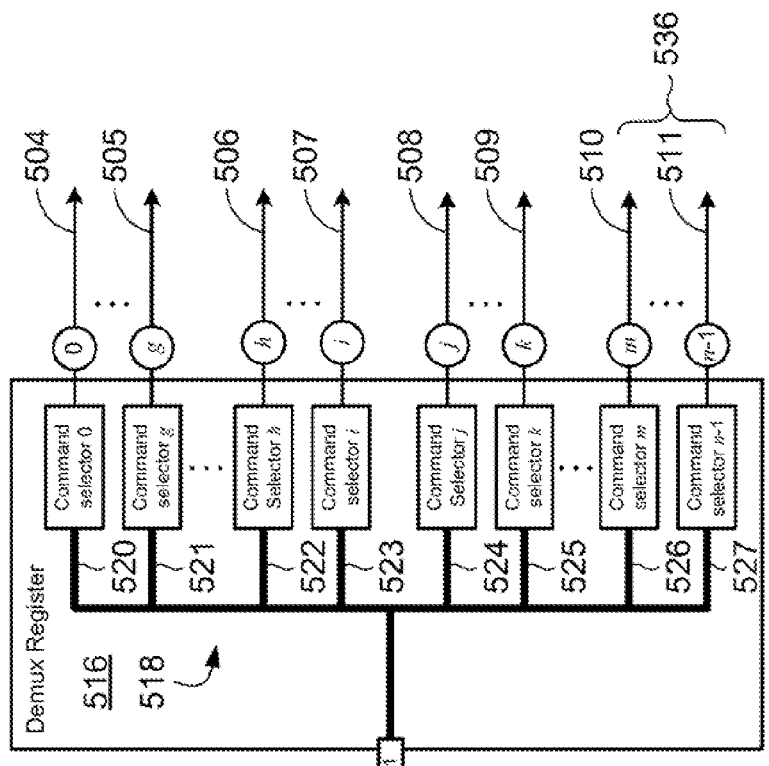
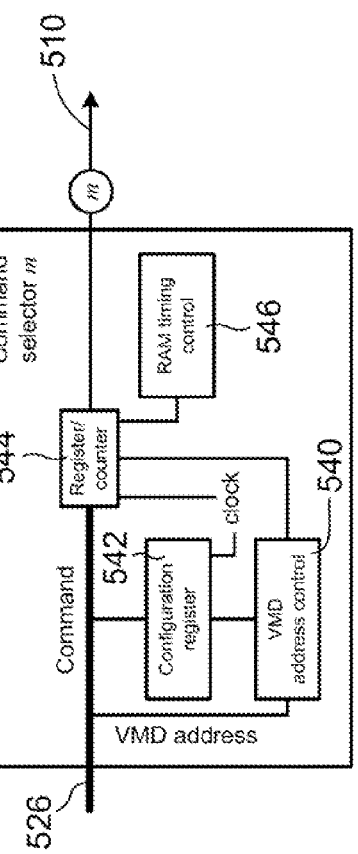
Figure 5B
Figure 5C

INDEPENDENTLY CONTROLLABLE AND RECONFIGURABLE VIRTUAL MEMORY DEVICES IN MEMORY MODULES THAT ARE PIN-COMPATIBLE WITH STANDARD MEMORY MODULES

TECHNICAL FIELD

Embodiments of the present invention are directed to memory modules, and, in particular, to memory modules configured to allow independent control of individual virtual memory devices comprising one or more memory chips.

BACKGROUND

In modern computer systems, demand for memory capacity and bandwidth keeps growing. Recent performance scaling of microprocessors relies on increasing the number of cores per chip, and multi-core and many core chip multiprocessors ("CMP") demand even higher memory bandwidth and capacity through multiple memory controllers per processor. The power budget of main memory modules is similar to or even higher than that of processors in current computer systems.

However, typical memory modules are energy inefficient. For example, too many bits are activated per memory access and most of the bits that are accessed are stored back without being used, wasting dynamic power. By exploiting locality of access patterns, multiple temporally adjacent memory accesses can be combined by either a compiler or memory controller to use more bits per memory activation. But these attempts achieve limited success in applications with irregular access patterns. The efficiency of this approach is restricted by the random nature of memory accesses in general applications and even exacerbated in CMP memory systems, since independent memory access requests from multiple threads are interleaved.

What is desired is a memory system enabling access to information that saves energy without significantly sacrificing system performance.

SUMMARY

Various embodiments of the present invention are directed multi-core memory modules. In one embodiment, a memory module includes memory chips, and a demultiplexer register electronically connected to each of the memory chips and a memory controller. The memory controller groups one or more of the memory chips into at least one virtual memory device in accordance with changing performance and/or energy efficiency needs. The demultiplexer register is configured to receive a command indentifying one of the virtual memory devices and send the command to the memory chips of the identified virtual memory device. In certain embodiments, the memory chips can be dynamic random access memory chips.

BRIEF DESCRIPTION OF THE DRAWINGS

FIGS. 5A-5E show general schematic representations of a multi-core, dual in-line memory module and associated demultiplexer registers configured in accordance with embodiments of the present invention.

DETAILED DESCRIPTION

Various embodiments of the present invention are directed to memory modules that can be reconfigured to improve the energy efficiency of memory systems with small impact on computer system performance. The term "performance" refers to the amount of useful work completed by a computer system versus the amount of time and number of resources used to complete the work. Performance metrics include bandwidth and latency. For example, a computer system with a high bandwidth and low latency has relatively higher performance than a system with a lower bandwidth and higher latency. The memory modules include memory chips that can be partitioned into groups of one or more memory chips. The groups are called "virtual memory devices" ("VMDs"). Each VMD has its own data path and can receive separate memory requests through a shared command path in a time-division multiplexed manner. The number of VMDs and the number of memory chips comprising each VMD can be selected during boot-up time, varied dynamically during runtime of an application, or determined by a computer system operator. In other words, the number of memory chips per memory access can be varied and selected to balance performance and energy efficiency demands.

The memory modules can also be configured to be pin-compatible with numerous memory module standards. In other words, the same memory slot used to support conventional memory modules can also be used to support memory modules of the present invention.

The detailed description is organized as follows. A general description of conventional memory modules and associated energy inefficiencies are described in a first subsection. A description of memory module embodiments is provided in a second subsection.

Memory Modules and Energy Inefficiencies in Accessing Memory

Figure 1A:
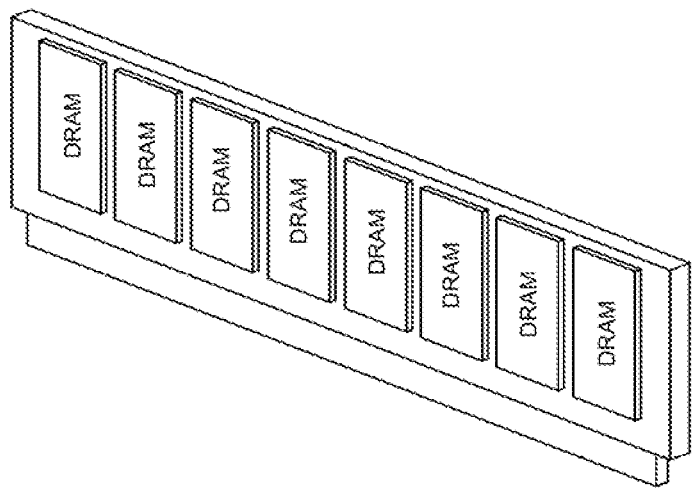
FIG. 1A shows an isometric view of a memory module with eight memory chips.
Figure 1B:
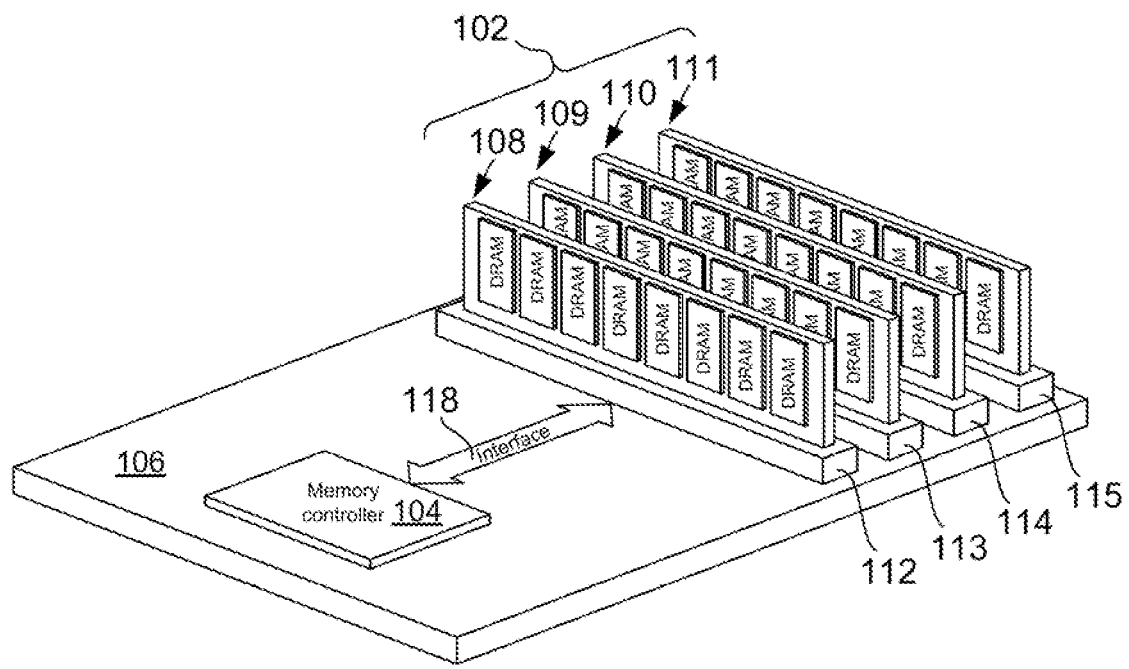
FIG. 1B shows an isometric view of memory modules and a memory controller mounted on circuit board.

Memory modules are typically comprised of several DRAM chips mounted on a printed circuit board forming a storage unit called a "dual-in-line memory module" ("DIMM"). FIG. 1A shows an isometric view of a single DIMM comprising eight DRAM chips. One or more DIMMs are then mounted on a circuit board and controlled by a memory controller. FIG. 1B shows an isometric view of memory 102 and a memory controller 104 mounted on circuit board 106. The memory 102 is composed of four DIMMs 108-111 inserted into four DIMM slots 112-115. The memory controller 104 can be a computer chip or be part of a multicore microprocessor chip that manages the flow of commands and data sent to and from the DIMMs 108-111 and interfaces the memory 102 with other major components of a computer system, such as the central processing unit. Each DIMM is in electrical communication with the memory controller 104 via an interface 118. The interface 118 is a bus that carries the clock signal and commands from the memory controller 104 to the memory 102 and data signals between the DIMMs 108-111 and the memory controller 104. Data signals are between the Memory controller 104 and DRAM chips in the DIMMs 108-111. The interface 118 can support single-data rate ("SDR"), double-data rate ("DDR"), and higher data rate transfers. SDR refers to transmitting data once per clock cycle, and DDR refers to transmitting data on both the rising and falling edges of the computer system clock signal. The memory controller 104 and the DIMMs 108-111 can be configured to transmit and receive data in accordance with SDR and DDR. By using both edges of the clock in DDR, the data signals operate at the same limiting frequency, doubling the data transmission rate over single-data rate transmissions.

Figure 2:
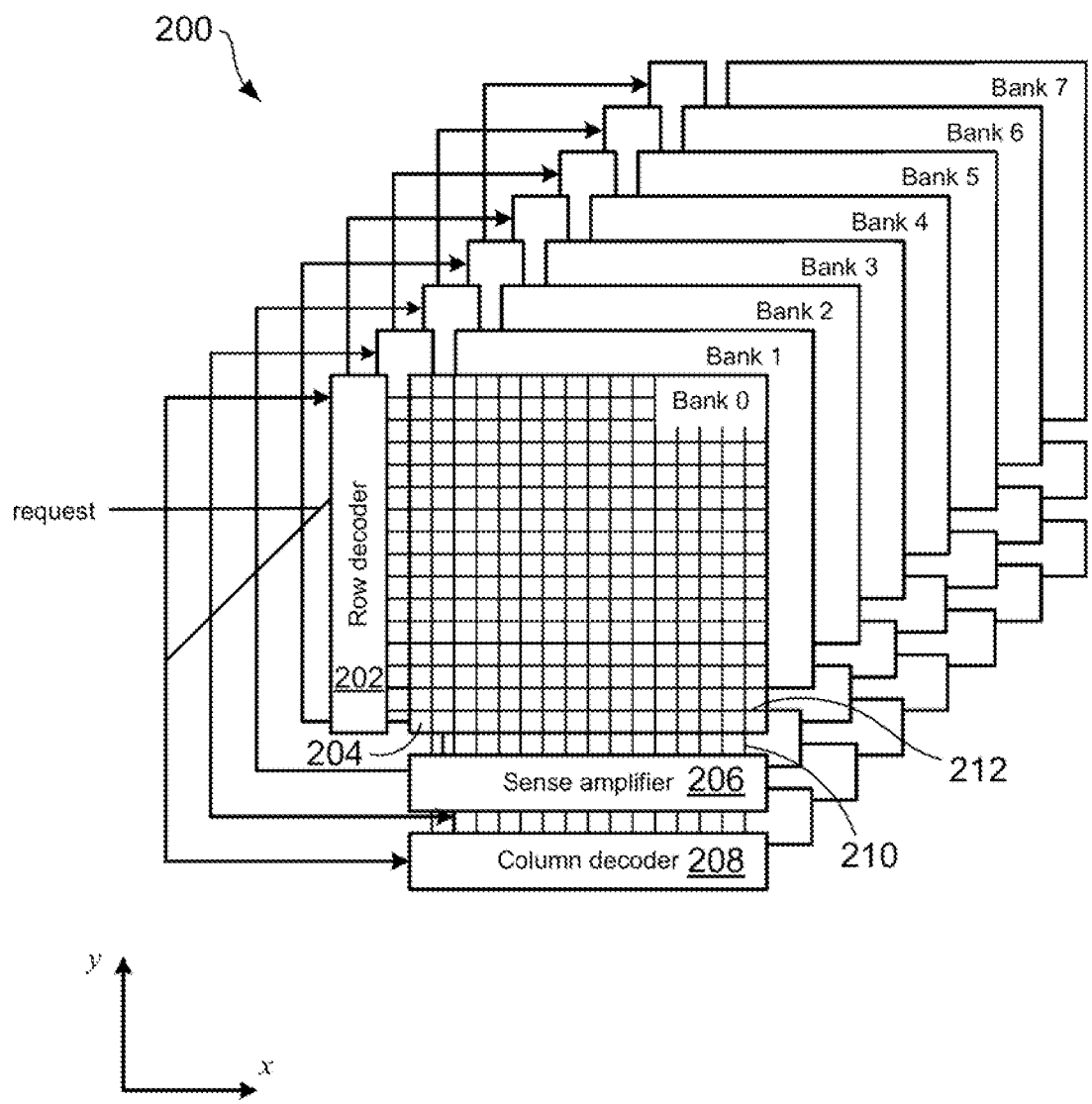
FIG. 2 shows a schematic representation of eight banks comprising a memory chip.

A DRAM chip stores a bit in a structure called a DRAM memory cell consisting of a transistor and a capacitor. There are billions of cells in a single DRAM chip and the cells can be organized in a two-dimensional arrangement of numerous two-dimensional arrays called "banks." FIG. 2 shows a schematic representation of eight banks denoted 0-7 comprising a DRAM chip 200. As shown in the example of FIG. 2, each bank is connected to a row decoder, a sense amplifier, and a column decoder via intersecting signal lines. For example, Bank 0 is connected to row decoder 202 via signal lines running parallel to the x-axis, such as signal line 204. Bank 0 is also connected to sense amplifier 206 and column decoder 208 via signal lines running parallel to the y-axis, such as signal line 210. Memory cells are located at signal line intersections. For example, a memory cell 212 is located at the point where signals 204 and 210 intersect.

The commands sent from the memory controller 104 to the memory 102 include READ, WRITE, ACTIVATE, REFRESH, and PRECHARGE. Commands are composed of control signals and address signals. A control signal represents the operation performed by the command and the address signal identifies the bank and row or column addresses in the DRAM chips where the command is performed. For example, an ACTIVATE command is composed of an activation control signal and bank and row addresses identifying which bank and row within a DRAM chip the ACTIVATE command is performed. READ and WRITE commands are composed of read and write control signals and bank and column addresses identifying in which bank and column in the DRAM chip the READ and WRITE commands are performed. READ and WRITE commands are also referred to as "memory requests."

Data stored in the banks of the DRAM chip 200 is accessed in two steps. First, a memory controller (not shown) sends an ACTIVATE command specifying a row address and a bank addresses of the DRAM chip 200. All bits in the row, which is typically 8 or 16 Kbits of the bank, are activated into sense amplifiers within the bank. Second, one or more READ/WRITE commands specifying the bank and column addresses are sent. The number of bits transferred per READ/WRITE, transaction is determined by the size of the data bus and the burst length. The burst length is a common memory-related, basic input/output system setting that controls the number of READ/WRITE operations performed in a single burst transaction or high-speed transmission of data blocks. Typically, the burst length is set to 4 or 8. When a DRAM chip receives memory request, for example, a memory READ request, the chip responds by supplying data across the signal lines of the interface 118. The size of the block of data sent in response to the memory READ request is determined by the burst length. A memory module with a 64 bit wide data bus (i.e., 64 single-ended signal lines or 128 differential signal lines) and DRAM chips configured to support a burst length of 4 sends a data block of 32 bytes (4×64 bits=32 bytes) in response to a single READ request from the memory controller. On the other hand, a memory module with a 64 bit wide data bus and DRAM chips configured to support a burst length of 8 sends a data block of 64 bytes (8×64 bits=64 bytes) in response to a single READ request from the memory controller When data is read in two different rows in the same bank of a DRAM chip, the first row must be written back, the bitlines charged, and the second row latched by the PRECHARGE and ACTIVATE commands before the data in the second row can be read. The PRECHARGE command writes the row back into the DRAM bank, which is necessary because the ACTIVATE command reads destructively. The bank address is given by a small number of bits in the READ, WRITE, ACTIVATE, and PRECHARGE commands. These command operations often take about 50 ns between a first ACTIVATE and a second ACTIVATE command in the same bank. Thus, unless there are many READ/WRITE commands between ACTIVATE and PRECHARGE commands, command/address/data buses often sit idle. However, if data is read in different banks, commands to different banks can be pipelined because the ACTIVATE to ACTIVATE time between two different banks is shorter by about 8 ns. Thus, higher throughput can be achieved by interleaving requests in different banks, especially when there are not many READ/WRITE commands between ACTIVATE and PRECHARGE command pairs.

Figure 3A:
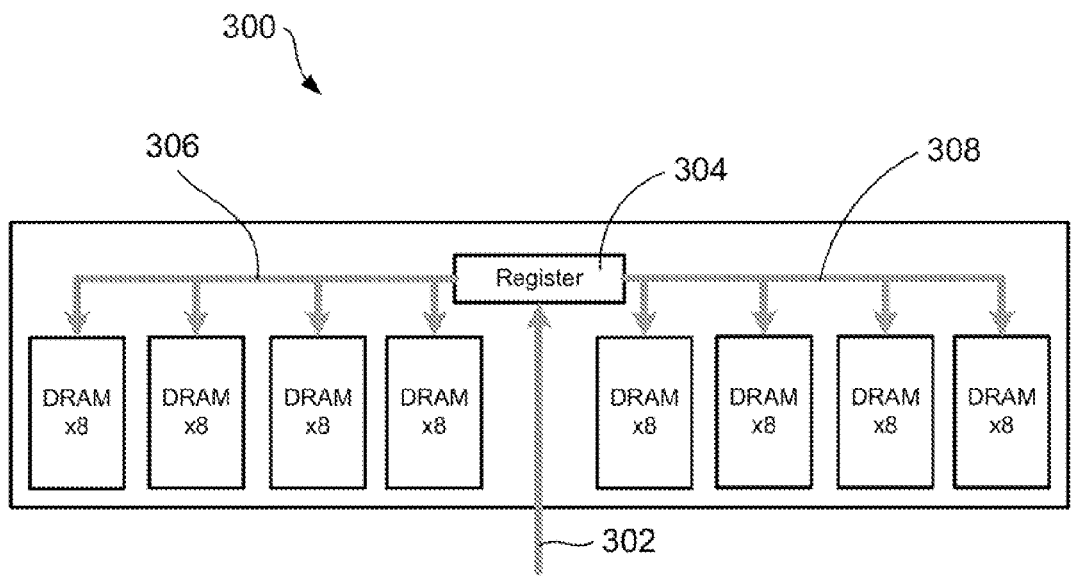
FIG. 3A shows a schematic representation of a conventional memory module.

FIG. 3A shows a schematic representation of a conventional DIMM 300 that includes 8 DRAM chips, each of which has an 8 bit data bus. Directional arrow 302 represents the distribution of commands that are sent from a memory controller (not shown) to an optional device called a register 302. The register 304 is located on a bus between the memory controller and the DRAM chips. The register 304 latches command signals from the memory controller then forwards them with better signal quality and timing margin to each DRAM chip in order to lessen the electrical load on the memory controller and maintain stability of command signals. The register 304 can also buffer commands and broadcast clock signals to DRAM chips to facilitate overlapping access to different DIMMs in systems with multiple DIMMs per memory controller. The register 304 broadcast the commands to all 8 DRAM chips over a bus, as indicated by branching directional arrows 306 and 308. In other conventional memory modules, commands are broadcast to the DRAM chips without the register 304.

Figure 3B:
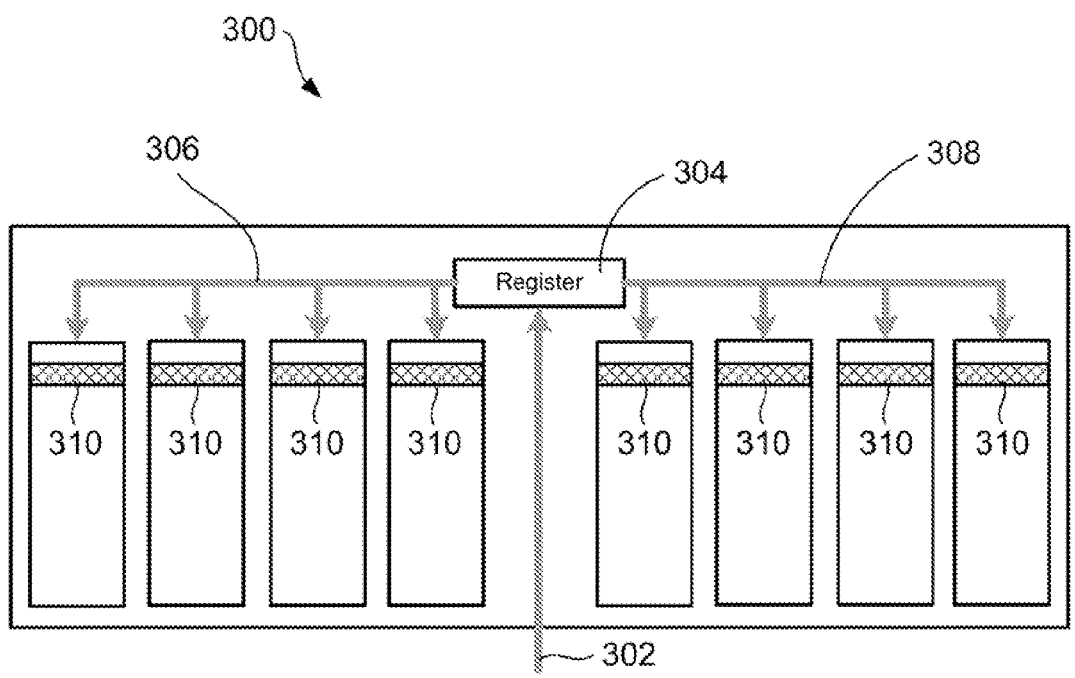
FIG. 3B shows an example of broadcasting a command to all memory chips of a conventional memory module.

FIG. 3B shows an example of a conventional DIMM operation. As shown in the example of FIG. 3B, all of the DRAM chips within the DIMM 300 receive the same commands from the memory controller and activate the same row in each DRAM chip represented by shaded regions 310. As a result, all of the DRAM chips within the DIMM 300 act as a single DRAM chip with wider data paths and larger rows.

As described above with reference to FIG. 2, the size of a DRAM chip row is typically 8 (or 16 Kbits). In order to read a cache line or write a cache line to a DIMM, the READ/WRITE command is broadcast to all DRAM chips, and each DRAM chip activates the same row. In other words, in a typical DIMM consisting of 8 DRAM chips, each DRAM chip activates the same row address comprising 8 Kbits. Thus 8×8 Kbits or 64 Kbits of DRAM cells of a DIMM are activated at one time, which is larger than the size of the cache line to be read or written. A typical cache line is on the order of 64 bytes or 512 bits. Because READ and WRITE commands are typically read and written in one cache line using less than 1% of the activated-DRAM cells, over 99% of the DRAM cells that are activated are unused for a single READ or WRITE transaction, which is an inefficient use of energy.

Embodiments of the Present Invention

Figure 4A:
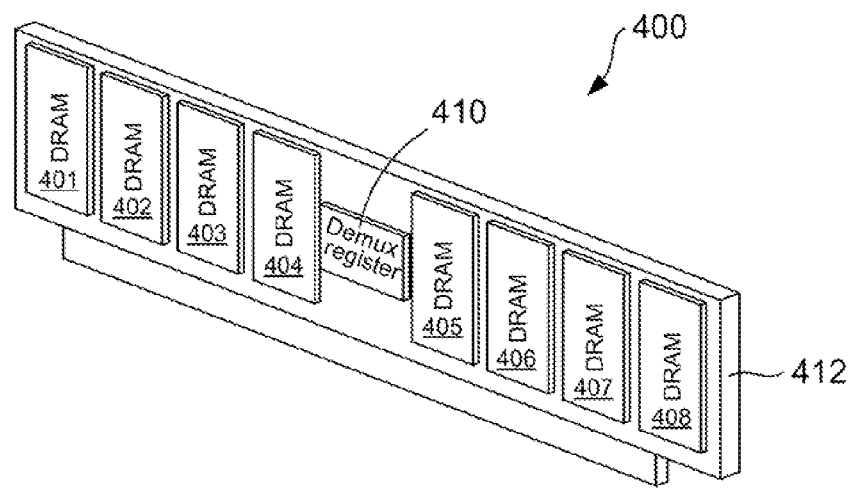
FIG. 4A shows an isometric view of a single multi-core memory module configured in accordance with embodiments of the present invention.

Memory module embodiments of the present invention include a demultiplexer register ("demux register") for receiving commands from a memory controller. Memory chips are mounted on a printed circuit board with the demux register to form a single storage unit called a "multi-core, dual in-line memory module" ("MCDIMM"). Each memory chip is in electrical communication with the demux register. In certain embodiments, the memory chips can be DRAM chips. FIG. 4A shows an isometric view of a single MCDIMM 400 comprising eight DRAM chips 401-408 and a demux register 410 mounted on a printed circuit board 412 in accordance with embodiments of the present invention. Each of the DRAM chips 401-408 is in electrical communication with the demux register 410 via a separate set of signal lines (not shown). The sets of signal lines comprise a command bus that enables the demux register 410 to separately send commands to each of the DRAM chips 401-408.

Figure 4B:
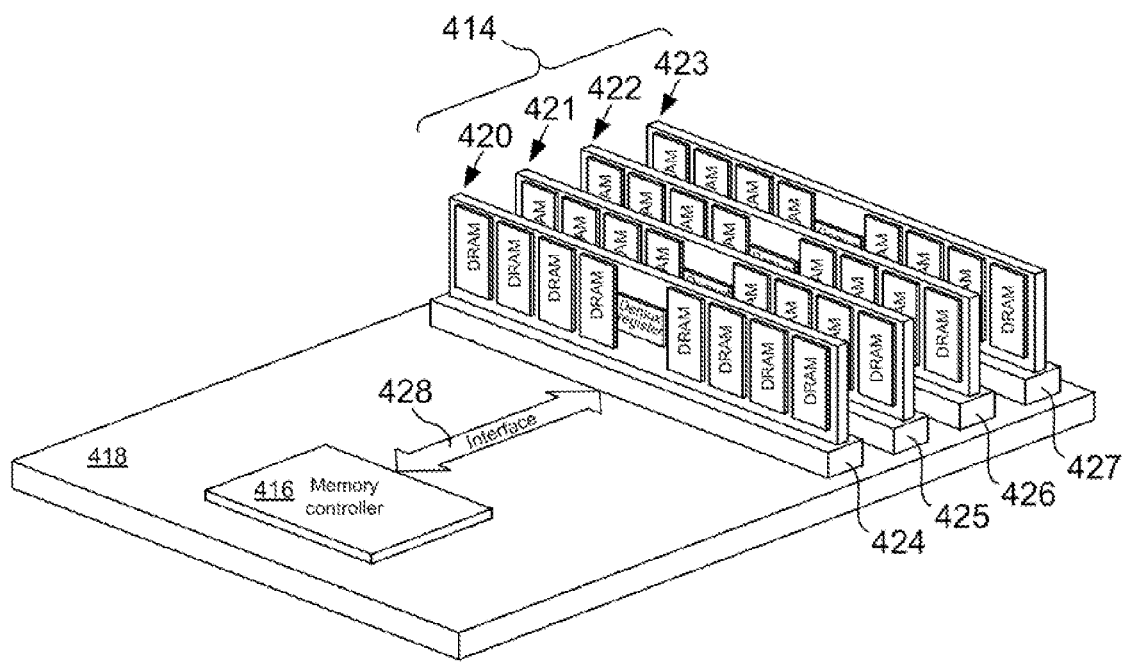
FIG. 4B shows an isometric view of multi-core memory modules and a memory controller mounted on circuit board in accordance with embodiments of the present invention.

One or more MCDIMMs can be mounted on a circuit board and controlled by a memory controller. FIG. 4B shows an isometric view of memory 414 and a memory controller 416 mounted on circuit board 418 in accordance with embodiments of the present invention. The memory 414 comprises MCDIMMs 420-423 inserted into DIMM slots 424-427, respectively. An interface 428 electronically connects the memory controller 416 and the demux registers of the memory modules 420-423. The interface 428 includes a bus that carries command signals from the memory controller 416 to the memory 414 and a data bus that carries data signals between the memory controller 416 and the memory 414. In this architecture, commands sent from the memory controller 416 are not broadcast to the DRAM chips of the memory 414. Instead, the memory controller 416 sends a memory configuration command ("CONFIGURE command") to the demux registers of the MCDIMMs 420-423 embedded with instructions specifying which DRAM chips comprise VMDs. In other words, the memory controller 416 groups one or more DRAM chips into each VMD to serve memory requests. Each VMD has its own data bus for independently transferring data to and from the memory controller 416. After the VMDs have been configured in accordance with the CONFIGURE command, the memory controller 416 can begin sending commands representing memory requests to VMDs of the MCDIMMs 420-423. In other embodiments, a sequence of two or more CONFIGURE commands may be used to change the MCDIMM's configuration.

As the number of VMDs per memory module increases, the energy consumed per data access decreases. However, increasing the number of VMDs increases the amount of time needed to extract the same quantity of data compared with having fewer VMDs, because the width of the data bus decreases as the number of memory chips per VMD decreases. There are a number of ways in which a configuration of VMDs can be determined. In one embodiment, the number of VMDs per memory module can be selected during machine boot-up time. For example, an operating system can maintain a history of memory and energy usage for particular applications that are typically run on the computer system. The operating system can then adjust the number of VMDs at boot-up time to balance system performance with energy efficiency. In another embodiment, the number of VMDs can dynamically change during runtime of an application. For example, an application may be able to monitor computer system performance and energy efficiency while the application is running and adjust the number of VMDs to satisfy the changing memory demands in accordance with energy efficiency requirements. In another embodiment, a computer system operator can monitor the performance and energy efficiency of a computer system and change the number of VMDs accordingly. In all three cases, the number of VMDs can be decreased where performance is a higher priority than energy efficiency, increased where energy efficiency is a higher priority than performance, or the number of VMDs can be adjusted periodically to strike a balance between performance and energy efficiency.

In certain embodiments, all of the memory modules in a computer system can be configured with the same number of VMDs. In other embodiments, each memory module can be configured with a different number of VMDs, and the VMDs can have different numbers of memory chips. FIGS. 5A-5E provide a general schematic representations of two different groupings of memory chips of the same MCDIMM in accordance with embodiments of the present invention.

Figure 5A:
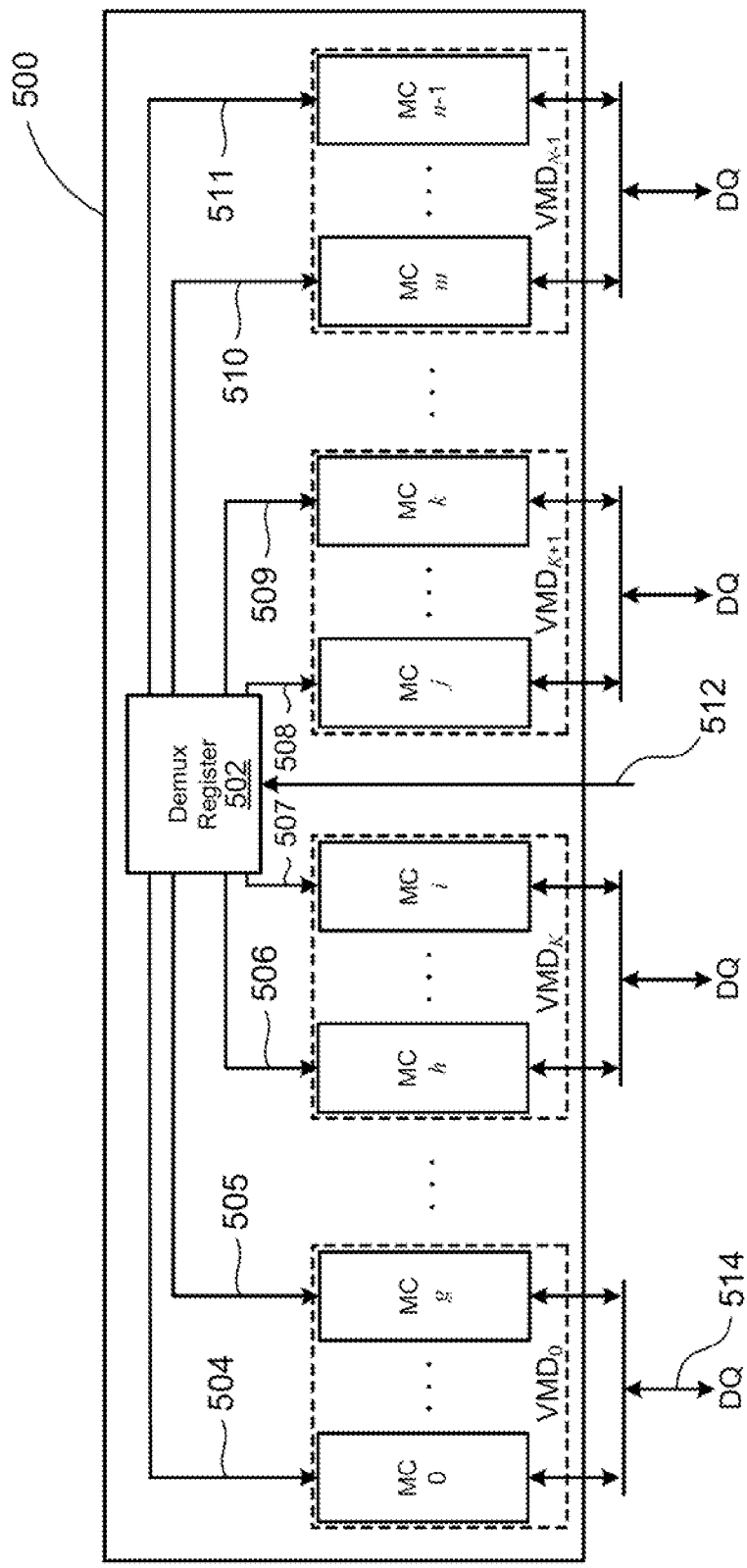

FIG. 5A shows a general schematic representation of a MCDIMM 500 comprising a demux register 502 and a first configuration of VMDs in accordance with embodiments of the present invention. The MCDIMM 500 includes n memory chips, where n is a whole number. In FIG. 5A, eight of then memory chips are represented and denoted by "MC" and each includes a lower case index representing a whole number. In certain embodiments, the memory chips can be DRAM chips. FIG. 5A also reveals the memory chips grouped into N VMDs, where N is a whole number. Four of the VMDs are represented in FIG. 5A and denoted by $VMD_K$, where the subscript K is a whole number ranging from 0 to N−1. For example, as shown in FIG. 5A, $VMD_0$ comprises $MC_0$ through $MC_g$, $VMD_K$ and $VMD_{K+1}$ comprise $MC_h$ through $MC_i$ and $MC_j$ through $MC_k$, respectiviely, and $VMD_{N-1}$ comprises $MC_v$ through $MC_{n-1}$, where g, h, i, j, k, and m are whole numbers satisfying the condition $0 \leq g < h \leq i < j \leq k < m \leq n-1$.

Each memory chip is electronically connected to the demux register 502 via signal lines. For example, directional arrows 504-511 represents separate sets of signal lines electronically connecting the demux register 502 to $MC_0$, $MC_g$, $MC_h$, $MC_i$, $MC_j$, $MC_k$, $MC_m$, and $MC_{n-1}$, respectively. The sets of signal lines comprise a command bus. A memory controller (not shown) selects the number of VMDs and, in particular, the number of memory chips per VMD based on instructions provided by an operating system, an application, or a computer system operator. The memory controller initially sends a CONFIGURE command directly to the demux register 502 over a set of signal lines 512 called a "command path." The CONFIGURE command includes instructions directing the demux register 502 to group the memory chips as shown in FIG. 5A. The VMDs each have an associated VMD address comprising at least $\log_2 n$ bits. Subsequent memory request commands include the VMD address. For example, when the memory controller sends a command representing a memory request for $VMD_0$, the memory controller embeds within the command the addresses of $VMD_0$. When the demux register 502 receives the command, the demux register 502 forwards the command onto the memory chips of the $VMD_0$. For example. $MC_0$ and $MC_g$ are two of the memory chips comprising $VMD_0$ which receive commands from the demux register 502 over the sets of signal lines 504 and 505. Each of the VMDs exchanges data with the memory controller on a separate data bus identified in FIG. 5A by DQ and double headed arrows, such as double headed arrow 514.

The demux register 502 can be configured in a number of different ways. FIG. 5B shows a schematic representation of a demux register 516 configured in accordance with embodiments of the present invention. The demux register 516 comprises n command selectors denoted 0 through n−1, one command selector for each of the n memory chips shown in FIG. 5A, and a broadcast bus 518. The command selectors are electronically connected to the broadcast bus 518 via branches 520-528, and each command selector is connected to one or more of the memory chips via the sets of signal lines 504-511 comprising the command bus described above with reference to FIG. 5A. In FIG. 5C, the sets of signal lines 504-511 also shown in FIG. 5A are labeled with the index of the corresponding memory chips shown in FIG. 5A. The memory controller sends time-division multiplexed commands on the command path 512, shown in FIG. 5A. In other words, each command is encoded in a bit stream and sent from the memory controller to the demux register 516 in a fixed duration time slot. In FIG. 5B, the time slots are represented by a series of rectangles 531-534. Each of the commands includes the index of the VMD in FIG. 5A that is intended to receive the command. The order in which the commands are sent to the demux register 516 is determined by the memory controller. Thus, the commands appear in FIG. 5B in that order. Embedded within a command is a control signal identifying the particular kind of operation to be performed, address signals identifying a bank, a row, or a column, and a VMD addresses assigned by the memory controller.

Each command sent to the demux register 516 is broadcast to all n of the command selectors. Each command selector is configured to extract the VMD address embedded in the command to determine whether the command is to be forwarded on to the corresponding memory chips of the VMD or whether the command is addressed to a different VMD, in which case the command is discarded. Thus, for each command that is broadcast to all n command selectors, the command is only sent by the command selectors to the memory chips comprising the VMD selected by the memory controller. For example, the demux register 516 receives and broadcasts the command N−1 531 to all n of the command selectors 0 through n−1. However, because the command N−1 531 includes the addresses of the $VMD_{N-1}$, the command selectors m through n−1 send the command N−1 531 to the corresponding memory chips of the $VMD_{N-1}$ over sets of signal lines 536 including signal lines 510 and 511. Note that each command is also processed separately by the demux register 516 within a particular time interval before a subsequent command is processed.

FIG. 5C shows a schematic representation of the command selector m configured in accordance with embodiments of the present invention. The other n−1 command selectors are analogously configured. The command selector m comprises a VMD address control 540, a configuration register 542, a register/counter 544, and a random access memory ("RAM") timing control 546. Commands are input to the command selector m on branch 526, also shown in FIG. 5B. The VMD address control 540 extracts the VMD address embedded in each command. The configuration register 542 stores the current VMD address of $VMD_{N-1}$ connected to signal line 510, shown in FIG. 5A. The configuration register 542 receives the clock signal to determine when to latch the VMD address of $VMD_{N-1}$ to the VMD address control 540. The VMD address control 540 compares the extracted VMD address with the VMD address of $VMD_{N-1}$ and sends a select signal to the register/counter 544 when the extracted VMD address matches the address of $VMD_{N-1}$. The register/counter 542 is a buffer that temporarily stores the command and sends the command to the corresponding memory $MC_m$ when the select signal is received from the VMD address control 540 on every rising and/or falling clock edge.

The register/counter 544 includes a counter. Counters are needed when the DRAM chips of a VMD cannot support a long burst length associated with a READ or WRITE transaction of a cache line. The demux register partitions the cache line into cache-line segments and translates the command into multiple commands, each command corresponding to a cache-line segment. Thus, each cache-line segment sent to the VMD is preceded by a corresponding command sent by the counter. For example, when the burst length of one or more DRAM chips of a VMD cannot be set long enough to cover a cache line, the counter translates a column-level command such as READ or WRITE into a number of READ/WRITE commands for each cache-line segment so that each cache-line segment can be separately READ from or WRITEN to the DRAM chip. Each counter includes a counting device that keeps track of the number of commands generated for a partitioned cache line. The translation carried out by the counters saves command bandwidth from the memory controller. The RAM timing control 548 controls the counter portion of the register/counter 546.

The configuration of N VMDs of the MCDIMM 500, shown in FIG. 5A, can be changed by sending a second CONFIGURE command from the memory controller to the demux register 502. The second CONFIGURE command is embedded with instructions directing the demux register 502 to group the VMDs in accordance with a different set of memory requirements that can be selected during a different hoot-up time, selected at a later point in time at the launch of or during the running of an application, or selected by a computer system operator.

Figure 5D:
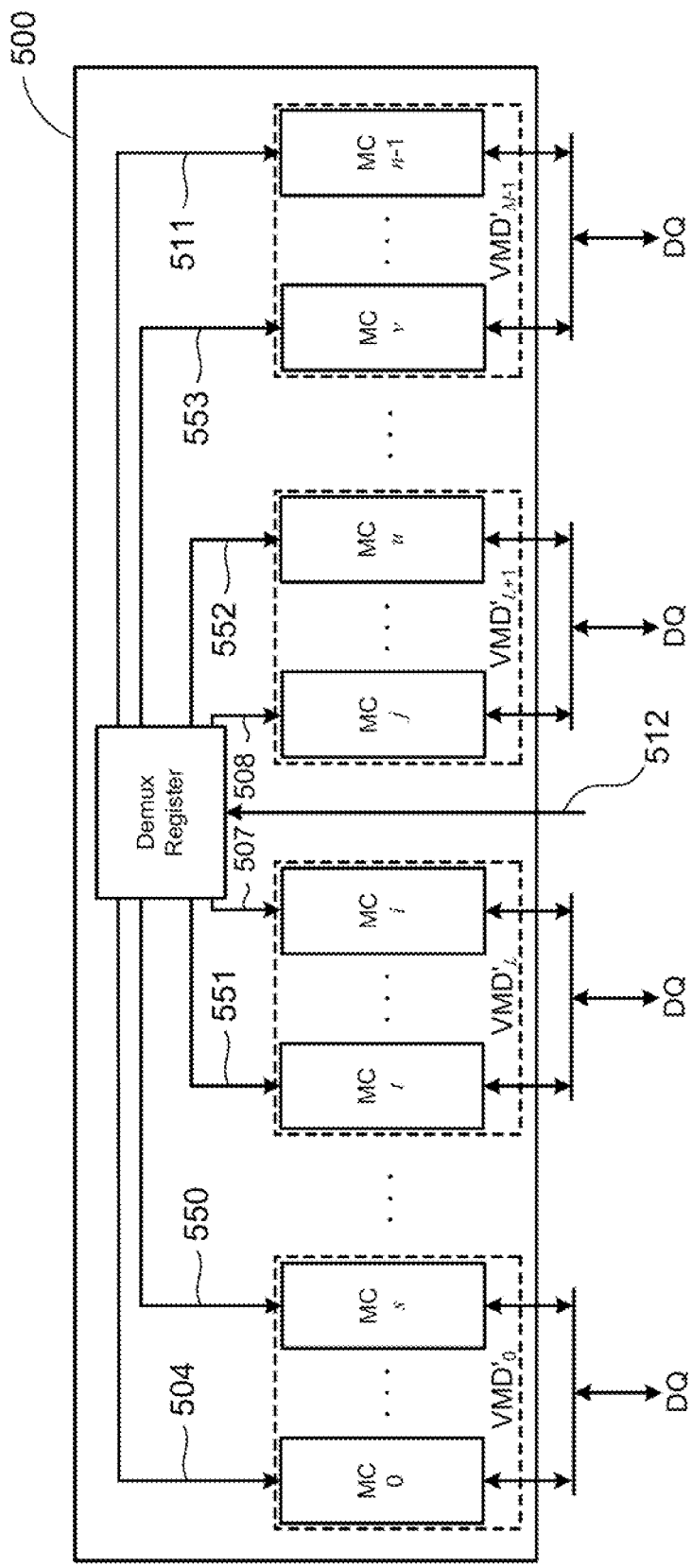

FIG. 5D shows a general schematic representation of the MCDIMM 500 with a second configuration of VMDs in accordance with embodiments of the present invention. The MCDIMM 500 includes the same n memory chips, but, as shown in FIG. 5D, the memory controller has reconfigured the number of VMDs and the number of memory chips per VMD. In particular, the index of four of the eight memory chips is changed to represent different groupings of memory chips comprising the VMDs. In FIG. 5D, the memory chips are grouped into M VMDs, where M is a whole number different from the number N. Four of the VMDs are represented in FIG. 5D and denoted by VMD'$_L$, where the subscript L is an integer ranging from 0 to M−1. Comparing the grouping of memory chips in FIG. 5D with the grouping of memory chips in FIG. 5A reveals that VMD'$_0$ comprises MC$_0$ through MC$_s$, where the integer s is different from the integer g; VMD'$_L$ and VMD'$_{L+1}$ comprise memory chips MC$_t$ through MC$_i$ and MC$_j$ through MC$_u$, respectively, where t and u are different from h and k; and VMD'$_{M-1}$ comprises MC$_v$ through MC$_{n-1}$, where the integer v is different from the integer m. Directional arrows 550-553 represent separate sets of signal lines electronically connecting the demux register 502 to MC$_s$, MC$_t$, MC$_u$, and MC$_v$, respectively.

Figure 5E:
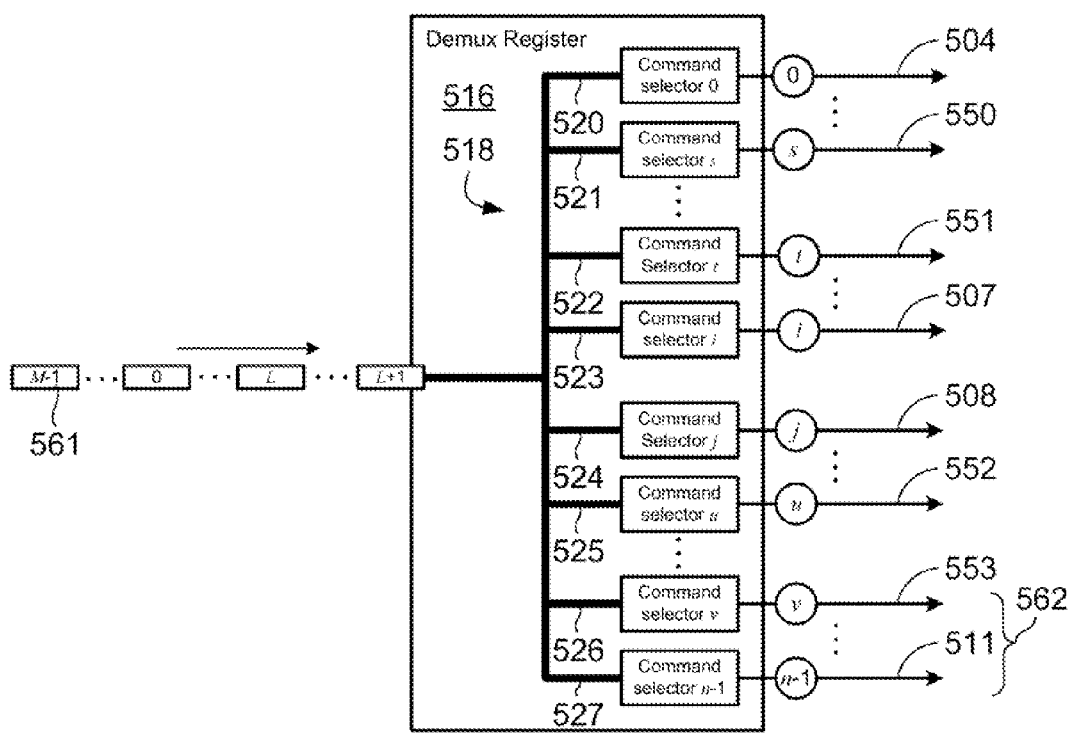

The demux register 516 remains essentially unchanged and is operated in the same manner as described above with reference to FIG. 5B except the second CONFIGURE command reconfigures the configuration register of each command selector. FIG. 5E shows the second demux register 516 configured as described above with reference to FIG. 5B. As described above with reference to FIG. 5B, each command sent to the demux register 530 is broadcast to all n of the command selectors. The VMD address control of each command selector is reconfigured to extract the VMD address, shown in FIG. 5D, embedded in the command to determine whether the command is forwarded on to the corresponding memory chips of the VMD or whether the command is addressed to a different VMD, in which case the command is discarded. For example, the demux register 516 receives and broadcast the command M−1 561 to all n of the command selectors 0 through n−1. However, because the command M−1 561 includes the VMD address of the VMD$_{M-1}$, the command selectors v through n−1 send the command M−1 571 to the corresponding memory chips of the VMD$_{M-1}$ over sets of signal lines 562 including signal lines 565 and 511. The remaining command selectors discard the command M−1 561.

A typical READ or WRITE command is a memory request associated with spreading data over several memory chips of a VMD. Reconfiguring the VMDs in accordance with changing performance and energy efficiency needs without restoring the data already stored in the MCDIMM under a previous configuration would leave the data irretrievable. Thus, method embodiments of the present invention include that prior to reconfiguring the VMDs of a memory module, the data already stored in the VMDs is fetched and temporarily stored in another memory device. After the VMDs have been reconfigured, the data is stored again in the memory module with the new VMD configuration.

As described above, a number of different groupings of memory chips into VMDs can be selected in order to accommodate a change in the amount of memory needed based on performance and/or energy efficiency needs. The memory chips described above with reference to FIGS. 5A and 5D are single memory chips having a one-to-one mapping with the command selectors of the demux register 516. However, embodiments of the present invention are not so limited. In other embodiments, there can be fewer command selectors than memory chips. For example, the memory chips MC$_0$, MC$_g$, MC$_t$, MC$_i$, MC$_j$, MC$_k$, MC$_m$, and M$_{n-1}$ in FIG. 5, can represent stacks of two or more memory chips that are in electrical communication with a single command selector. The following is a description of exemplary MCDIMMs having 8 or 16 DRAM chips, describing how the VMDs can be reconfigured in accordance with embodiments of the present invention.

Figure 6A:
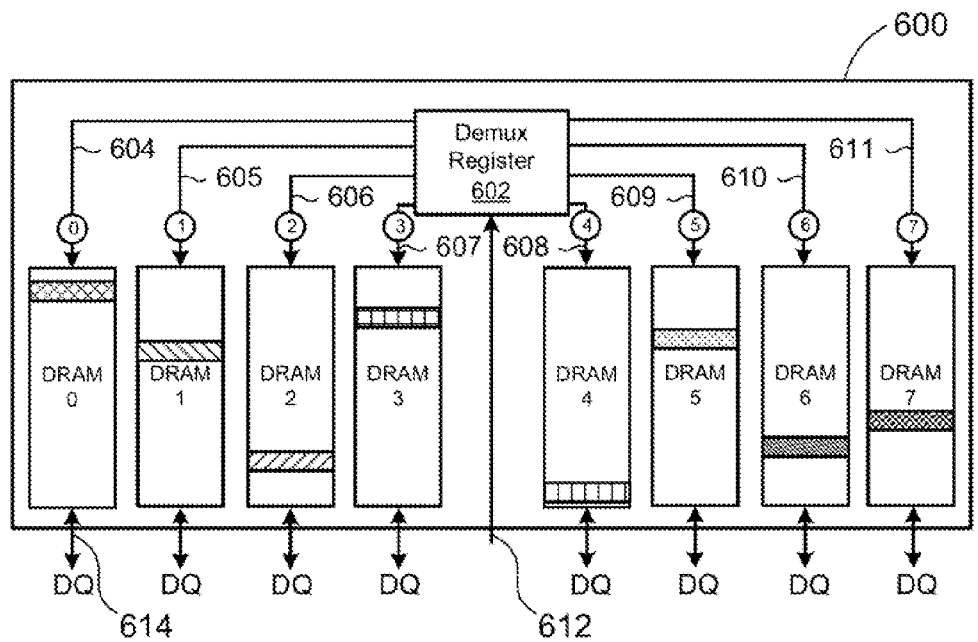
FIGS. 6A-6C show schematic representations of an exemplary multi-core, dual in-line memory module and associated demultiplexer registers with a first configuration of memory modules configured in accordance with embodiments of the present invention.

FIG. 6A shows a schematic representation of a MCDIMM 600 configured in accordance with embodiments of the present invention. As shown in FIG. 6A, the MCDIMM 600 includes a demux register 602 and 8 VMDs, each of which comprises a single DRAM chip labeled 0-7. This first configuration of VMDs can be the result of assessing the amount of memory needed at boot-up time, at a point in time during the running of an application, or selected by a computer system operator. Directional arrows 604-611 represent eight separate sets of signal lines electronically connecting each of the DRAMs 0-7 with the demux register 602, respectively. Commands are sent to the demux register 602 from, a memory controller (not shown) on the command path 612. According to $\log_2 N$, where N is equal to 8, each of the DRAMs 0-7 can be assigned one of the three bit addresses 000, 001, 010, 011, 100, 101, 110, and 111, respectively. Each of the DRAM chips 0-7 receives different commands through a corresponding set of signal lines of the command bus and transfers data, independent of other DRAM chips, via its own data bus, represented by DQ and double headed arrows, such as double headed arrow 614.

Figure 6B:
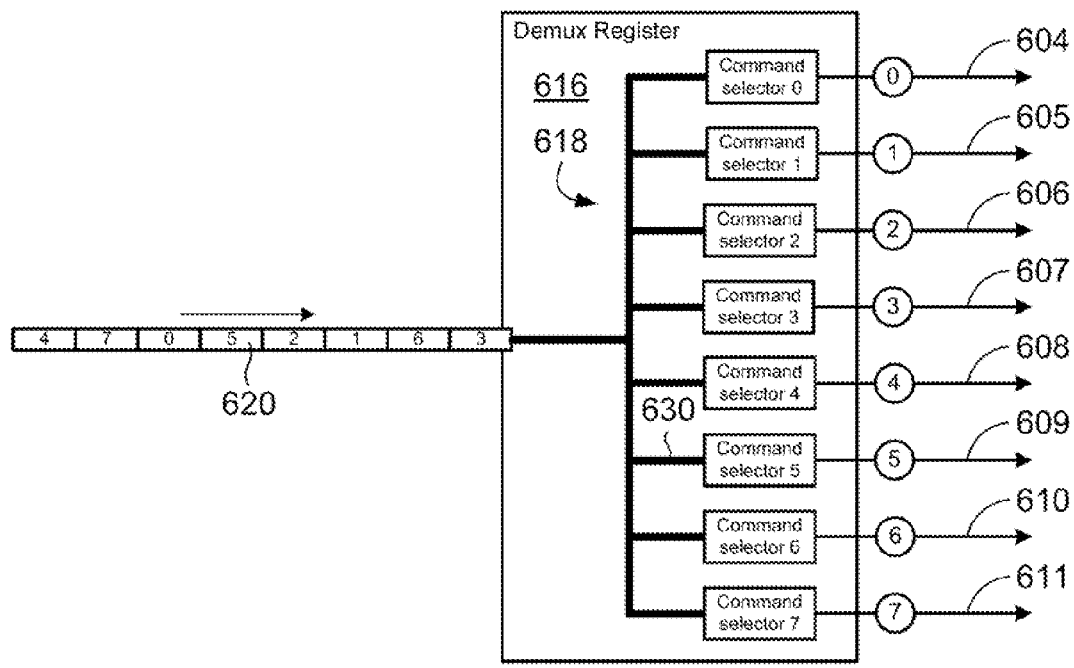

The maximum number N of VMDs that this MCDIMM can support is 8, which is also the number of command selectors needed for the demux register 602. FIG. 6B shows a demux register 616 comprising a broadcast bus 618 and command selectors denoted 0-7 which can be used in place of the demux register 602 to support the MCDIMM 600 having 8 VMDs. Each command is broadcast to all 8 command selectors. In FIG. 6B, each time slot associated with a command is represented by a rectangle including the index of the DRAM chip in FIG. 6A that is intended to receive the command. Each command selector is configured to extract the VMD address embedded in the command to determine whether the command is to be forwarded on to the connected DRAM chip or whether the command is addressed to a different DRAM chip and discarded. For example, the demux register 616 receives and broadcasts the command 5 620, which is destined for DRAM chip 5 to all 8 command selectors over broadcast bus 618. Because the command 5 620 includes the address of DRAM chip 5, the command selector 5 sends the command 5 620 to the DRAM chip 5 on the set of signal lines 609, and the other command selectors discard the command 5 620.

Figure 6C:
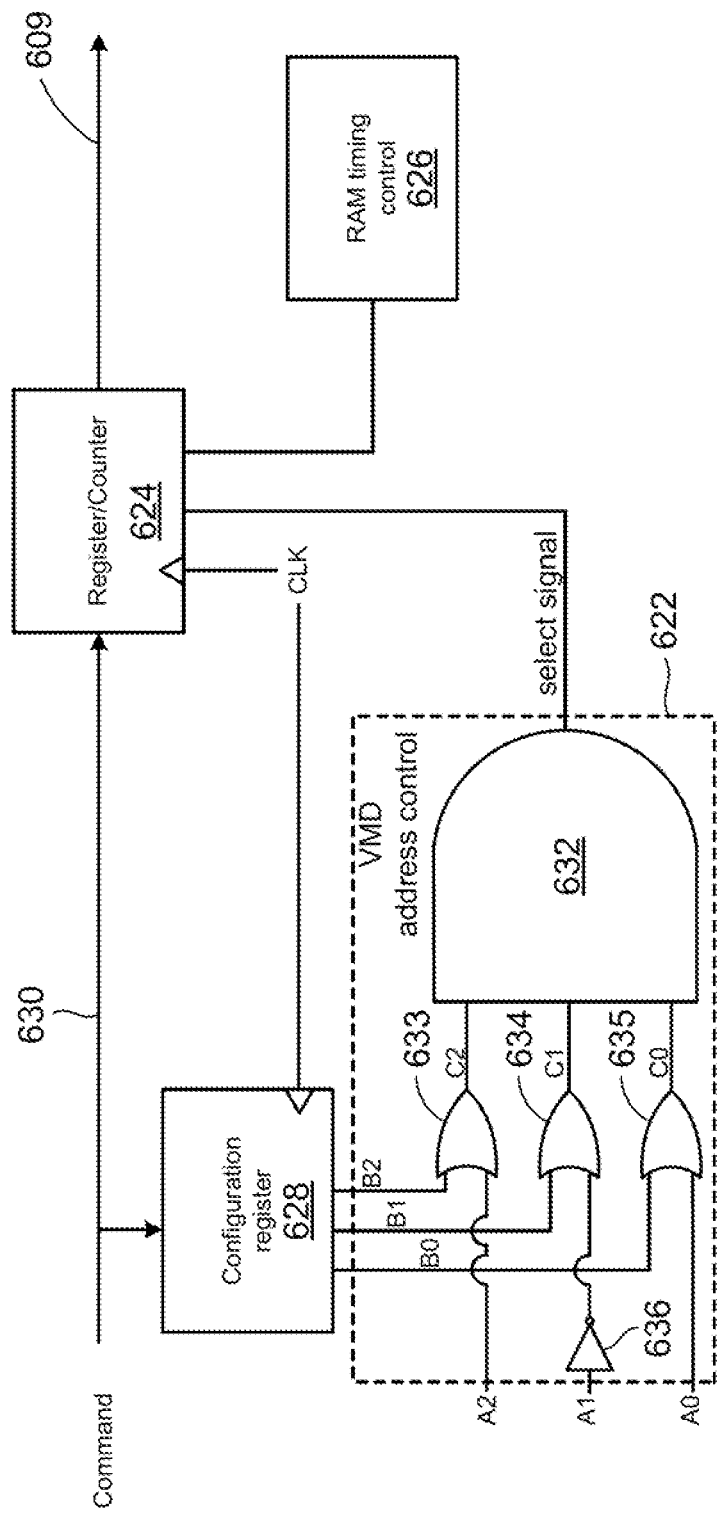

FIG. 6C shows a schematic representation of the command selector 5 configured in accordance with embodiments of the present invention. The description relates to an embodiment with a maximum number of N equal to 8 VMDs. Thus, 3 ($\log_2 8$) bits addresses 000, 001, 010, 011, 100, 101, 110, and 111 are used in commands to identify each DRAM chip 0-7, respectively. The command selector 5 comprises a VMD address control 622, a register/counter 624, a RAM timing control 626, and a configuration register 628. The other command selectors are analogously configured. Commands are input to the command selector 5 on branch 630, also shown in FIG. 6B. The VMD address control 622 further comprises an AND gate 632, three OR gates 633-635, and an inverter 636. The VMD address control 622 extracts the VMD address portion of each command. Three address signal lines identified as A2, A1, and A0 each carry one bit of the extracted three bit VMD address. The bit on signal line A1 passes through the inverter 636. The configuration register 628 outputs three bits on signal lines 132, B1, and B0, where A2 and B2 are inputs for OR gate 633, A1 and B1 are inputs for OR gate 634, and A0 and B0 are inputs for OR gate 635. The outputs C2, C1, and C0 of OR gates 633-635 are inputs for AND gate 632. The AND gate 632 outputs a signal corresponding to the bit "1" when all of the input signals correspond to the bit "1" and outputs a signal corresponding to the bit "0" when at least one of the input signals corresponds to the bit "0," where bits "1" and "0" can represent high and low voltages of a signal, respectively. On the other hand, each of the OR gates 633-635 outputs a bit "0" only when all of the inputs are "0" and outputs a bit "1" when at least one of the inputs is bit "1." The inverter converts a bit "1" into a bit "0" and vice-versa.

In this embodiment, the VMD configuration register 628 holds a bit mask (having the same number of bits, $\log_2 N$, as the VMD address) to be used in determining whether or not the command selector in which it resides is one of the selectors comprising the VMD specified in an incoming command. A "0" bit in the mask causes the corresponding bit (in the same position) of the VMD address to be significant, while a "1" bit in the mask makes the corresponding bit of the VMD address insignificant or "don't care", meaning that this VMD address bit has no effect on the command selector's output. For the VMD configuration shown in FIG. 6A, the configuration register 628 always outputs the VMD address bits on the signal lines B2, B1, and B0. For example, assume the extracted VMD address comprises the bits 101, which is the 3-bit VMD address of the DRAM chip 5. The inverter 536 inverts the voltage of the signal carried on line A1. Thus, A2, A1, and A0 signal lines after the inverter 536 carry the bits 111, and the output lines of the OR gates 633-635 carry the bits 111 into the AND gate 632. The AND gate 632 responds by outputting the select signal representing the bit "1" to the register/counter 624, which latches the command onto the set of signal lines 609 when indicated by the clock. For other addresses, because the configuration register 628 outputs the bits 000, the bit stream entering the AND gate 632 includes at least one "0" bit. Thus, the AND gate 632 outputs no signal or a low signal corresponding to the bit "0," and the register/counter 624 does not latch the command onto the set of signal lines 609.

Returning to FIG. 6A, only one DRAM chip is involved per memory access request. Shaded regions of the DRAM chips 0-7 represent different independent memory requests associated with different commands. Each DRAM chip receives a command over the command bus and independently transfers data using its own data bus. Thus fewer bits are activated, saving energy for activation and precharging. However, in order to transfer the data, the data may be partitioned into smaller data serialized portions, where each portion is sent separately from a DRAM chip to the memory controller. Serializing the data increases the amount of time needed to send the data as compared to sending the data over a larger data bus. This serialization latency problem may have a negative impact on system performance. It may be determined by the operating system, an application, or by a computer system operator monitoring the system that the time needed to transfer data can be decreased by increasing the number of memory chips in certain VMDs. Thus, as described above with reference to FIGS. 5A-5E, embodiments of the present application enable the operating system, an application, or a computer system operator to mitigate the serialization latency problem by reconfiguring the MCDIMM 600 with VMDs having groups of two or more DRAM chips.

The configuration of VMDs of the MCDIMM 600, shown in FIG. 6A, is changed by sending a CONFIGURE command from the memory controller (not shown) to the demux register 602. The CONFIGURE command is embedded with instructions directing the configuration register of each command selector to group the VMDs in accordance with a different set of memory requirements. The memory requirements may be the result changing memory demands determined during the running of an application that can be selected at a point in time during the running of the application, determined during boot-up time in accordance with a history of memory demands associated with the application, or determined by a computer system operator monitoring performance and energy efficiency of the MCDIMM 600. The changing memory requirements can be the result of a change in balancing performance and energy efficiency of the memory module.

Note that data already stored in the MCDIMM 600 under the VMD configuration shown in FIG. 6A is fetched and temporarily stored in a different storage device while the MCDIMM 600 is reconfigured. After the MCDIMM 600 is reconfigured, the temporarily stored data is written to the reconfigured MCDIMM 600.

Figure 7A:
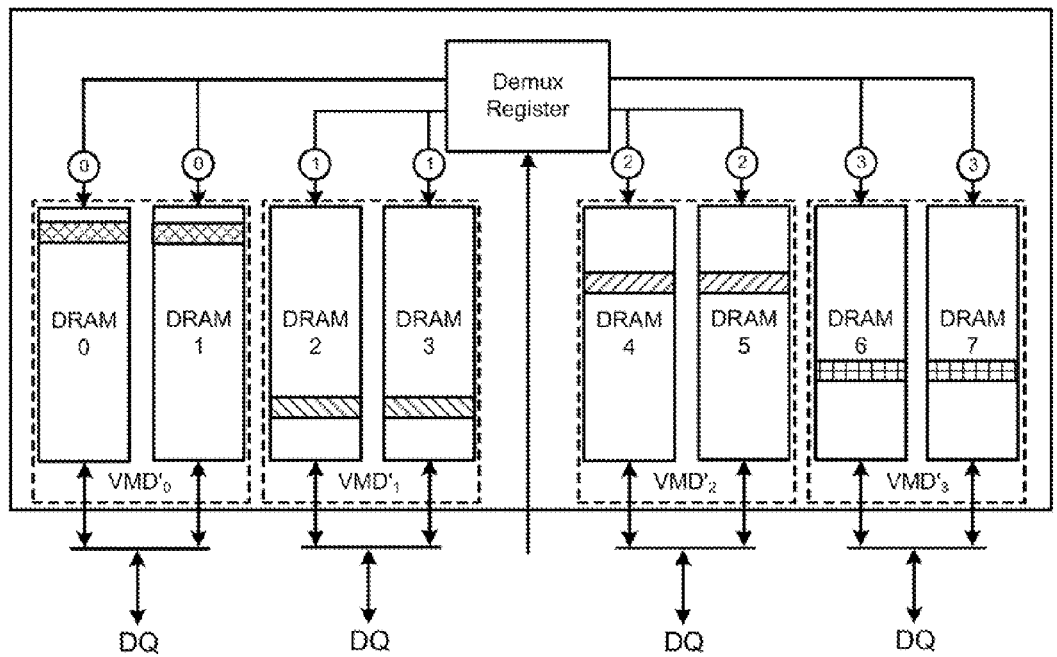
FIGS. 7A-7B show schematic representations of two different VMD configurations of multi-core, dual in-line memory modules shown in FIG. 6 in accordance with embodiments of the present invention.

FIG. 7A shows a schematic representation of the MCDIMM 600 with the DRAM chips 0-7 grouped into 4 VMDs identified as VMD'$_0$, VMD'$_1$, VMD'$_2$, and VMD'$_3$ with VMD addresses 00, 01, 10, and 11, respectively. Each of the VMD's comprises two DRAM chips. Each of the VMDs transfers data independent of other VMDs via its own data bus, represented by QD and double headed arrows, such as double headed arrow 702. In order to use the MCDIMM 600 in this configuration, the memory controller sends a CONFIGURE command to the demux register 602. The demux register 602 responds by reconfiguring the configuration registers with new hit masks. The demux register 602 sends subsequent commands with memory requests to the VMDs in the same manner, as described above with reference to FIGS. 6B-6C. For example, a command sent to VMD'$_1$ includes the VMD address of VMD'$_1$. The demux register 602 receives the command and sends the command only to the DRAM chips 2 and 3, as described above with reference to FIGS. 6B-6C.

For the VMD configuration shown in FIG. 7A, the configuration register 628 always outputs the VMD address on the signal lines B2, B1, and B0. This is true of the configuration registers in each of the command selectors 0-7. The lines A0 and B0 carry the bit in the ones or right-most position of the VMD address and are referred to as the least significant bits ("LSBs"). The LSBs are input to the OR gate 635. When the LSB output from the configuration register 628 is "1" the LSB VMD address bit is ignored. For example, when the LSB output from the configuration register 628 is "1," the register/counter 624 receives a select signal from the AND gate 632 when the extracted VMD address is 100 or 101. The first two bits 10 correspond to the VMD address of the VMD'$_2$. The LSB of the VMD address is ignored and has no effect whatsoever while the MCDIMM is in the present configuration.

Note that in the other embodiments where MCDIMM 600 is operated as a conventional DIMM and all of the DRAM chips comprise a single VMD, the configuration register of each command selector is sent a CONFIGURE command directing the configuration registers of command selectors 0-7 to output the bits 111. In this configuration, the select signal generated by the VMD address control 622 is always a "1."

Figure 7B:
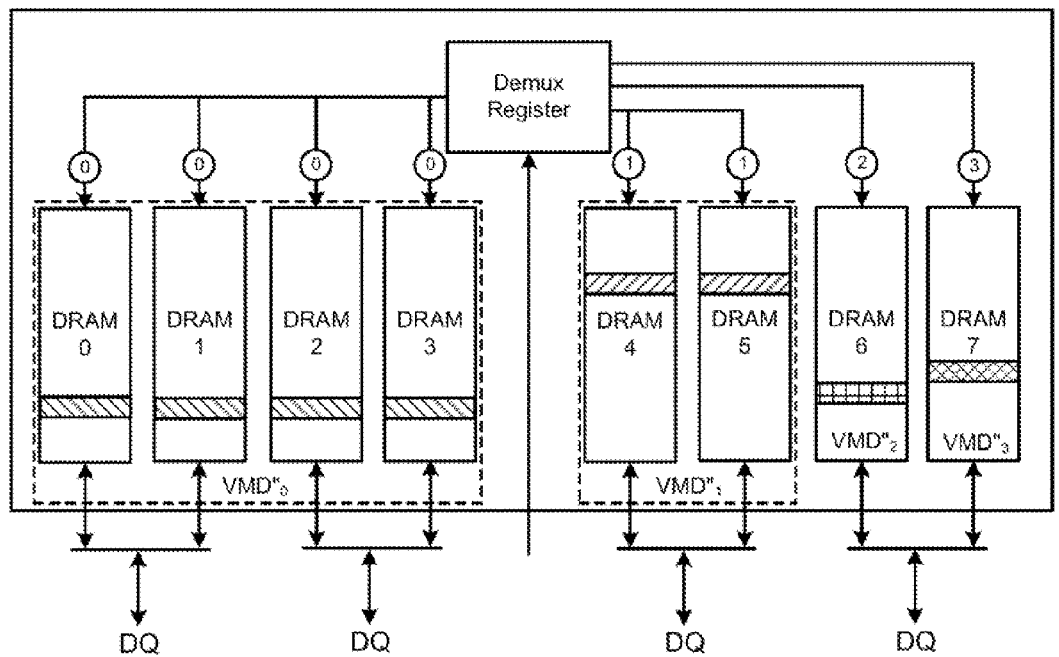

The VMDs are not restricted to having the same number of memory chips. The VMDs can be reconfigured with different numbers of memory chips. FIG. 7B shows a schematic representation of the MCDIMM 600 with the DRAM chips grouped into four VMDs in accordance with embodiments of the present invention. As shown in FIG. 7B, the DRAM chips 0-3 are grouped into a VMD"$_0$, DRAM chips 4-6 are grouped into a VMD"$_1$, and VMD"$_2$ and VMD"$_3$ comprise the DRAM chips 6 and 7, respectively The embodiment of the command selector shown in FIG. 6C allows this, under the control of the memory controller, by allowing different bit masks to be stored in the configuration registers of the command selectors.

Figure 8:
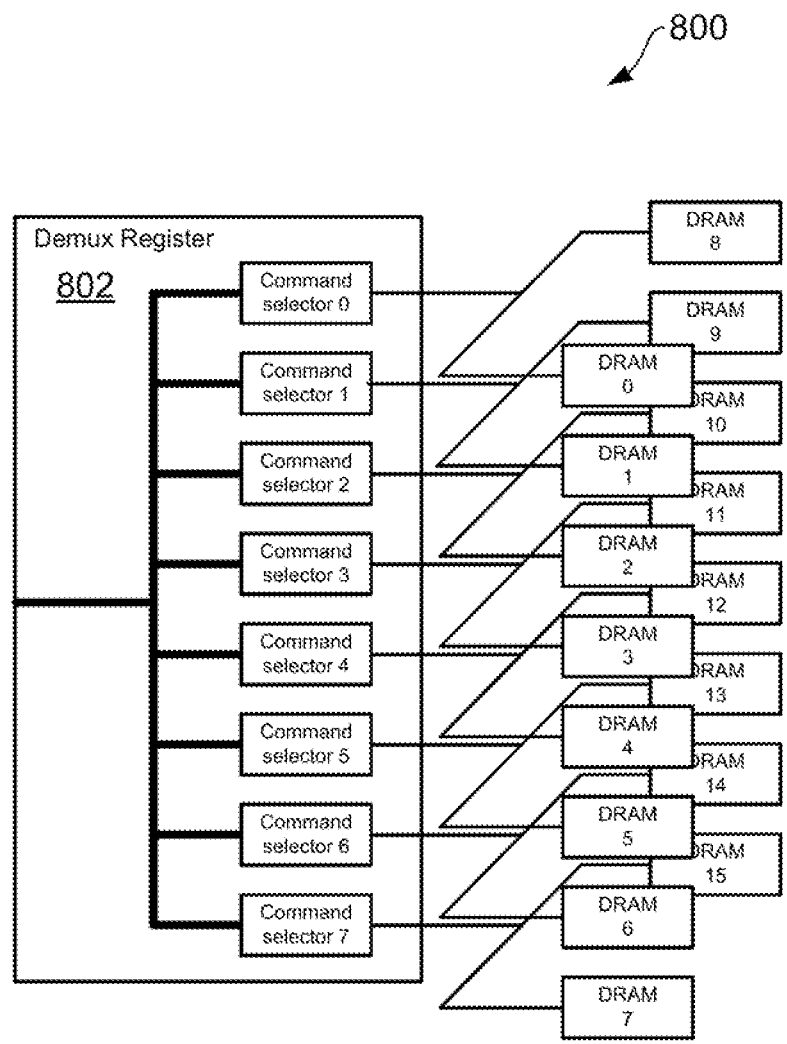
FIG. 8 shows a schematic representation of a multi-core, dual in-line memory module comprising 16 memory chips in accordance with embodiments of the present invention.

FIG. 8 shows a schematic representation of an MCDIMM 800 comprising 16 DRAM chips denoted 0-15 electronically connected to a demux register 802 in accordance with embodiments of the present invention. The demux register 802 includes 8 command selectors where each command selector is electronically connected to a pair of DRAM chips. For example, command selector 0 is electronically connected to the pair of DRAM chips 0 and 8. Each pair of DRAM chips represents a DRAM chip stack. The data lines of each pair of stacked DRAM chips are connected together, and an address hit selects between the two of them.

Figure 9:
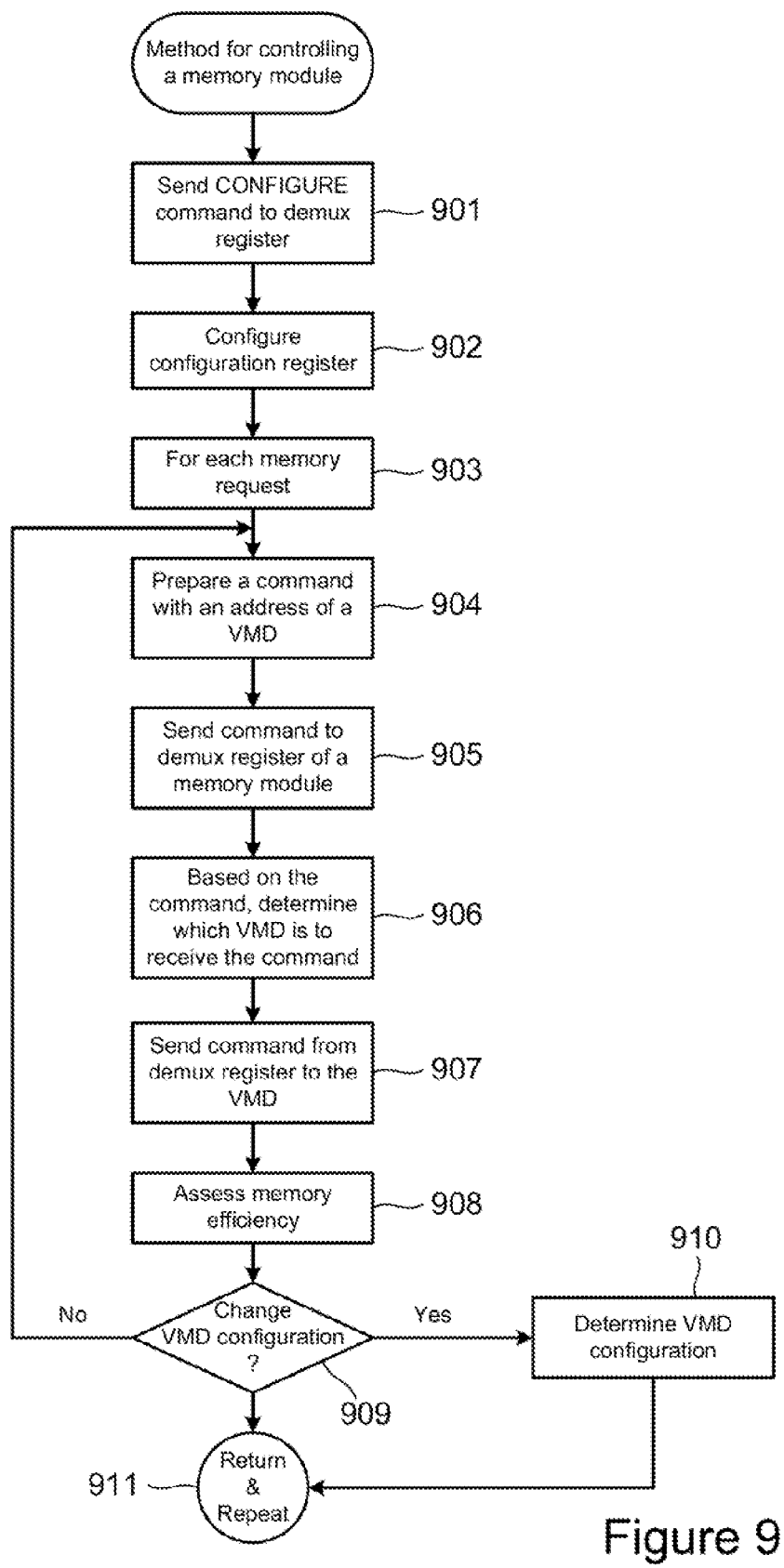
FIG. 9 shows a control-flow diagram of a method for controlling a memory module and configuring virtual memory devices in accordance with embodiments of the present invention.

FIG. 9 shows a control-flow diagram of a method for controlling and reconfiguring the VMDs of a memory module in accordance with embodiments of the present invention. In step 901, a CONFIGURE command with instructions for configuring VMDs of a memory module is created and sent from a memory controller to the memory module. In step 902, the configuration register of the demux register is configured in accordance with the CONFIGURE command, as described above with reference to FIGS. 5C-5E and FIGS. 6-7. In the for-loop of step 903, steps 903-908 are repeated for each memory request. In step 904, the memory controller prepares a command to be received by one of the VMDs by encoding the address of the VMD in the command. In step 905, the memory controller sends the command to a demux register of the memory module. The command is received by the demux register over a command path, as described above with reference to FIG. 5A. In step 906, the demux register determines which VMD is to receive the command, as described above with reference to FIG. 5B-5C. In step 907, the demux register selects the appropriate set of signal lines to send the command to the VMD, as described above with reference to FIGS. 5B-5C. In step 908, each memory request can be monitored and information collected regarding performance and energy efficiency in order to assess whether the current VMD configuration provides adequate storage and meets energy efficiency needs. In step 909, when the VMD configuration fails to provide adequate performance and/or energy efficiency needs, the method proceeds to step 910, otherwise, the method proceeds to step 911. In step 910, a different VMD configuration is determined by an operating system at boot-up time, by an application during runtime of the application, or by a computer system operator. In step 911, the method returns to step 901 and steps 901-909 are repeated.

In other embodiments, the MCDIMMs can be configured to be pin-compatible with the DIMM standards. The term "DIMM standard" refers to the number of pins located at the DIMM interface. For example, certain DIMMs can be configured with 168 pins and other DIMMs can be configured with 184 pins. A memory controller can be configured to detect and utilize all different VMD configurations described above with reference to FIGS. 5-8 and configured to detect and utilize standard DIMMs as described above with reference to FIG. 3. When an MCDIMM is pin-compatible with existing DIMMs, no new memory slot standard is needed. An MCDIMM can simply replace an existing DIMM by inserting the MCDIMM into a standard pin-compatible DIMM slot. Typically, a DRAM chip and DIMM standard reserve more address bits than necessary to specify a location in a DRAM chip. A portion of these additional bits can be used to specify one or more VMDs within the MCDIMM, which sacrifices the maximum DRAM capacity supported by a DIMM standard. In order to detect the type and number of VMDs of an MCDIMM, a mode register embedded within one of the DRAM chips can be extended to encode this information. In addition separate pins in the memory module can be dedicated to transmitting information from the mode register to the memory controller. Thus, in certain embodiments, a memory controller can check each memory module and determine whether the memory module is a standard DIMM, such as DIMMs 108-111, or whether the memory module is an MCDIMM having a number of different fixed or reconfigurable VMDs. In other embodiments, the memory controller can be configured to use $\log_2 N$ of the address bits as the VMD address, resulting in no loss of address range.

Figure 10:
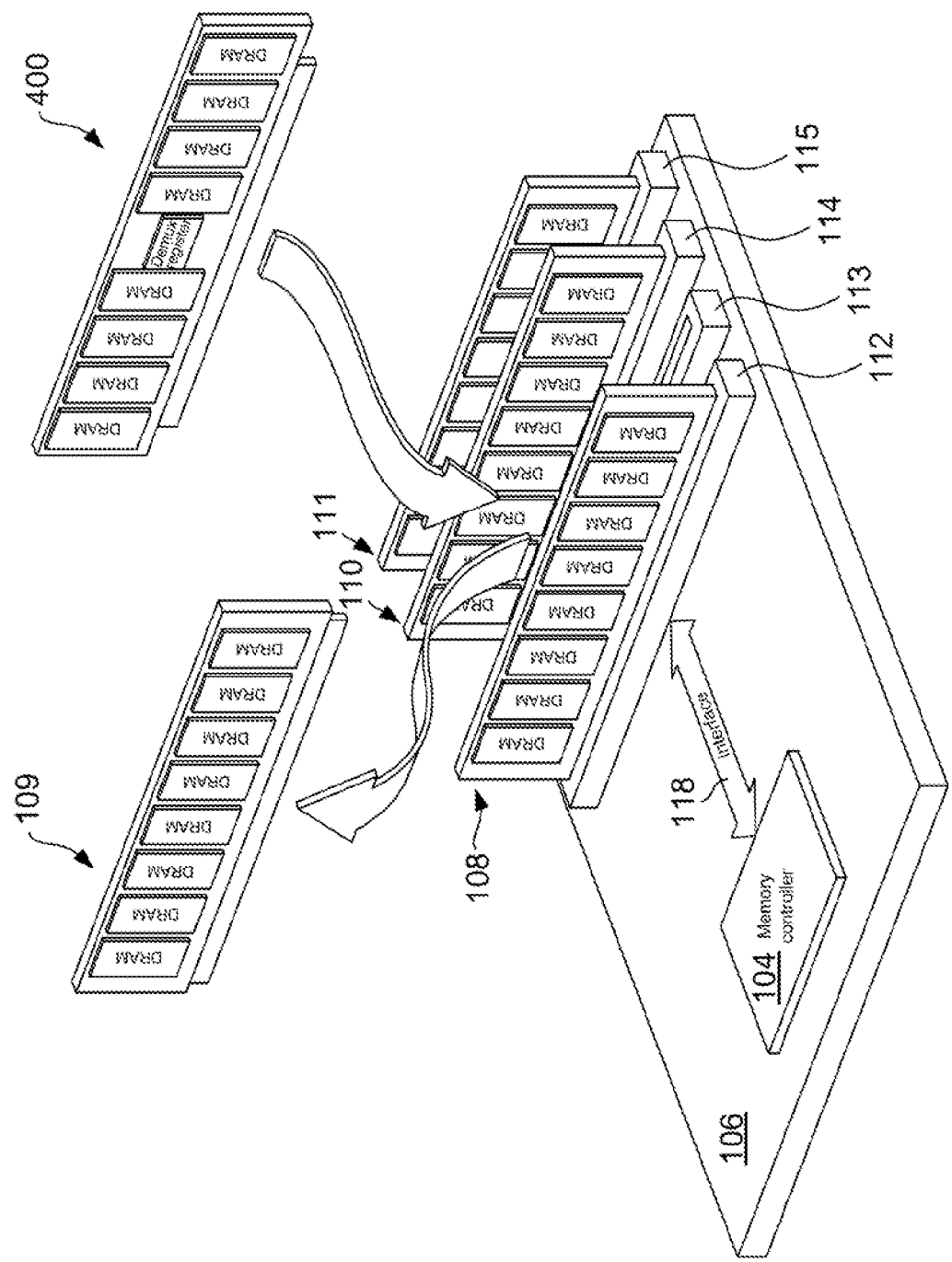
FIG. 10 shows replacing a standard dual in-line memory module, shown in FIG. 1, with a multi-core dual in-line memory module, shown in FIG. 4, in accordance with embodiments of the present invention.

FIG. 10 shows replacing DIMM 109, shown in FIG. 1, with the MCDIMM 400, shown in FIG. 4A, in accordance with embodiments of the present invention. As shown in FIG. 10, the MCDIMM 400 is pin-compatible with DIMMs 108-111 and thus, DIMM 109 can be removed and MCDIMM 400 inserted into DIMM slot 113. When the memory controller 104 is configured to detect and utilize all different VMD configurations for the MCDIMM 400, the MCDIMM 400 can transmit information to the memory controller 104 regarding the addresses and the number of VMDs. The memory controller 104 can then begin operating the MCDIMM 400 as described above with reference to FIGS. 6-8. However, the memory controller 104 can also be configured to utilize only the DIMMs 108, 110, and 111 as described above with reference to FIG. 3. In other embodiments, a memory controller 104 that does not support use of the MCDIMM 400 can use the MCDIMM 400 in the same manner as the standard DIMMs 108-111.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purposes, of illustration and description. They are not intended to be exhaustive of or to limit the invention to the precise forms disclosed. Obviously, many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

The invention claimed is:

1. A memory module comprising:
memory chips on a printed circuit board; and
a demultiplexer register on the printed circuit board, wherein the demultiplexer register is electronically connected to each of the memory chips and a memory controller, wherein the memory controller groups one or more of the memory chips into at least one virtual memory device in accordance with changing performance and/or energy efficiency needs and the memory controller generates a configuration command sent from the memory controller to the demultiplexer register, the demultiplexer register is configured to receive a command identifying one of the at least one virtual memory devices and send the command to the memory chips of the identified virtual memory device, and the configuration command includes instructions directing the demultiplexer register to reconfigure the at least one virtual memory device with one or more different memory chips of the memory module.

2. The memory module of claim 1 wherein the memory controller groups the one or more memory chips into the at least one virtual memory device in accordance with instructions provided by an operating system, an application, or a computer system operator.

3. The memory module of claim 1 wherein the memory chip further comprises a dynamic random access memory chip.

4. The memory module of claim 1 wherein the commands are sent from the memory controller to the demultiplexer register in a time-division multiplexed manner so that each command arrives at the demultiplexer register and is sent to the virtual memory device identified in the command within a fixed duration time interval.

5. The memory module of claim 1 wherein the demultiplexer register further comprises:
   at least one command selector, each command selector electronically connected to one of the memory chips; and
   a broadcast bus configured to broadcast the command to the at least one command selector, wherein each command selector is configured to extract a memory address embedded in the command and forward the command to the connected memory chip when the address matches the address of the connected memory chip, otherwise the command selector discards the command.

6. The memory module of claim 5 wherein the at least one command selector further comprises:
   an AND gate configured to extract the memory chip address from the command and generate a select signal when the address matches the address of the connected memory chip;
   a register/counter configured to receive and transmit the command to the connected memory chip when the AND gate provides the select signal, otherwise the register/counter discards the command; and
   a RAM timing control that controls partitioning of a cache line and the command into smaller cache-line segments.

7. The memory module of claim 1 the demultiplexer register electronically connected to each of the memory chips further comprises a command bus disposed between the demultiplexer register and the memory chips, wherein the command bus comprises separate set of signal lines connecting each of the memory chips to the demultiplexer register.

8. The memory module of claim 1 wherein the memory module is configured to be pin-compatible with DIMM standards.

9. A method for controlling a memory module comprising:
   providing the memory module, wherein the memory module includes memory chips on a printed circuit board and a demultiplexer register on the printed circuit board, wherein the demultiplexer register is electronically connected to each of the memory chips and a memory controller, wherein the memory controller groups one or more of the memory chips into at least one virtual memory device in accordance with changing performance and/or energy efficiency needs, and the demultiplexer register is configured to receive a command identifying the at least one virtual memory device and send the command to the memory chips of the identified virtual memory device;
   configuring at least one virtual memory device comprising at least one memory chip;
   sending a command from the memory controller to the demultiplexer register of the memory module, the command identifying the memory chips of the at least one virtual memory device;
   sending the command from the demultiplexer register to the at least one memory chip of the at least one virtual memory device identified in the command; and
   reconfiguring the at least one virtual memory device based on changes in system performance and/or energy efficiency needs by temporarily storing data already stored in the at least one virtual memory device prior to reconfiguring the at least one virtual memory device and then storing the data in the at least one reconfigured virtual memory device.

10. The method of claim 9 further comprising preparing the command at a memory controller to include the addresses of the at least one virtual memory device.

11. The method of claim 9 wherein configuring the at least one virtual memory device further comprises one of:
   determining the number of memory chips needed per virtual memory device during run time of an application;
   determining the number of memory chips needed per virtual memory device during boot-up; and
   determining the number of memory chips needed per virtual memory device by a computer system operator.

* * * * *